(12) United States Patent
Van Boxtel et al.

(10) Patent No.: US 8,675,169 B2
(45) Date of Patent: Mar. 18, 2014

(54) GAS MANIFOLD, MODULE FOR A LITHOGRAPHIC APPARATUS, LITHOGRAPHIC APPARATUS AND DEVICE MANUFACTURING METHOD

(75) Inventors: Frank Johannes Jacobus Van Boxtel, Eindhoven (NL); Marinus Johannes Maria Van Dam, Venlo (NL); Johannes Christiaan Maria Jasper, Veldhoven (NL); Ronald Van Der Ham, Maarheeze (NL); Sergei Yurievich Shulepov, Eindhoven (NL); Gerben Pieterse, Eindhoven (NL); Marco Baragona, Delft (IT); Pieter Debrauwer, Vught (NL); Antonius Arnoldus Henricus Van Der Steen, Best (NL)

(73) Assignee: ASML Netherlands B.V., Veldhoven (NL)

( * ) Notice: Subject to any disclaimer, the term of this patent is extended or adjusted under 35 U.S.C. 154(b) by 272 days.

(21) Appl. No.: 13/273,817

(22) Filed: Oct. 14, 2011

(65) Prior Publication Data
US 2012/0092631 A1    Apr. 19, 2012

Related U.S. Application Data

(60) Provisional application No. 61/394,444, filed on Oct. 19, 2010.

(51) Int. Cl.
*G03B 27/52* (2006.01)
*G03B 27/42* (2006.01)

(52) U.S. Cl.
USPC ................................. 355/30; 355/53

(58) Field of Classification Search
USPC ................................. 355/30, 53, 77
See application file for complete search history.

(56) References Cited

U.S. PATENT DOCUMENTS

| | | | |
|---|---|---|---|
| 7,525,640 B2* | 4/2009 | Jansen et al. | 355/67 |
| 7,717,229 B2* | 5/2010 | Putnam | 181/213 |
| 8,325,322 B2* | 12/2012 | Hauf et al. | 355/30 |
| 2008/0123066 A1 | 5/2008 | Jansen et al. | |
| 2010/0195067 A1 | 8/2010 | Nagasaka et al. | |

FOREIGN PATENT DOCUMENTS

| | | |
|---|---|---|
| JP | 10-012517 | 1/1998 |
| JP | H10-61431 | 3/1998 |
| JP | 11-154643 | 6/1999 |
| JP | 2000-252668 | 9/2000 |
| JP | 2002-373850 | 12/2002 |
| JP | 2008-118135 | 5/2008 |
| JP | 2008-292761 | 12/2008 |

(Continued)

OTHER PUBLICATIONS

Japanese Office Action mailed Nov. 2, 2012 in corresponding Japanese Patent Application No. 2011-224983.

(Continued)

*Primary Examiner* — Hung Henry Nguyen
(74) *Attorney, Agent, or Firm* — Pillsbury Winthrop Shaw Pittman LLP

(57) ABSTRACT

A gas manifold to direct a gas flow between two plates of an optical component of a lithographic apparatus, the gas manifold having an inlet, a diffuser downstream of the inlet, a flow straightener downstream of the inlet, a contractor downstream of the flow straightener, and an outlet downstream of the contractor.

20 Claims, 9 Drawing Sheets

(56) References Cited

FOREIGN PATENT DOCUMENTS

| TW | 200907593 | 2/2009 |
| TW | 201003329 | 1/2010 |
| TW | 201009512 | 3/2010 |
| WO | 00/22656 | 4/2000 |
| WO | 03/105203 | 12/2003 |

OTHER PUBLICATIONS

V. V. Kozlov et al., "Development of finite-amplitude disturbances in Poiseuille flow," J. Fluid. Mech., vol. 147, pp. 149-157 (1984).

Timothy W. Kao et al., "Experimental investigations of the stability of channel flows. Part 1. Flow of a single liquid in a rectangular channel," J. Fluid Mech., vol. 43, Part 1, pp. 145-164 (1970).

Satish C. Reddy et al., "On Stability of Streamwise Streaks Channel Flows," J. Fluid. Mech., pp. 1-40 (Jan. 23, and Transition Thresholds in Plane 1998).

P. W. Carpenter et al., "Hydrodynamics and compliant Current Science, vol. 79, No. 6, pp. 758-765 (Sep. walls: Does the dolphin have a secret?" 25, 2000).

Jerome Hoepffner et al., "Mechanisms of non-modal energy between compliant walls," J. Fluid Mech., vol. 642, pp. amplification in channel flow 489-507 (2010).

Mihailo R Jovanovic, "Turbulence suppression in channel wall oscillations," Phys. Fluids, vol. 20, No. 014101, pp. flows by small amplitude transverse 014101-1 - 014101-11 (2008).

S. J. Lee et al., "Flow field analysis of a turbulent boundary Experiments in Fluids, vol. 30, pp. 153-166 (2001). layer over a riblet surface,".

D.G. MacManus et al., "Measurement and Analysis of the Perforations," Aiaa Journal, vol. 36, No. 9, pp. 1553-1561 Flowfields Induced by Suction (Sep. 1998).

J. Goldsmith, "Research and Reports on Laminar Flow Northrop Aircraft Report No. Nai-56-304, pp. 1-72 (Mar. Boundary Layer Control Systems,".

Ronald D. Joslin, "Aircraft Laminar Flow Control," Ann. (1998). Review Fluid Mech., vol. 30, pp. 1-29.

D.G. MacManus et al., "Flow physics of discrete boundary predictions," J. Fluid Mech., vol. 417, pp. 47-75 (2000). layer suction-measurements and.

A. Elofsson et al., "Experiments on the stability of streamwise Physics of Fluids, vol. 11, No. 4, pp. 915-930 (Apr. 1999). streaks in plane Poiseuille flow,".

Fredrik Lundell et al., "Experiments on control of streamwise Mechanics B/ Fluids, vol. 22, pp. 279-290 (2003). streaks," European Journal of.

V. Theofilis et al., "Viscous linear stability analysis of rectangular Mech., vol. 505, pp. 249-286 (2004). duct and cavity flows," J. Fluid.

Kathtyn M. Butler et al., "Three-dimensional optimal perturbations Fluids a, vol. 4, No. 8, pp. 1637-1650 (Aug. 1992). in viscous shear flow," Phys.

Fabian Waleffe, "Homotopy of exact coherent structures vol. 15, No. 6, pp. 1517-1534 (Jun. 2003). in plane shear flows," Phys. Fluids,.

B. Lagraa et al., "Characterization of low-speed streaks in the near-wall region of a turbulent boundary layer," European Journal of Mechanics B/Fluids, vol. 23, pp. 587-599 (2004).

William S. Saric, "Görtler Vortices," Annu. Rev. Fluid Mech., vol. 26, pp. 379-409 (1994).

N. P. Mikhailova et al., "Optimal control of free-stream turbulence intensity by means of honeycombs," Fluid Dynamics, vol . 29, No. 3, pp. 429-437 (1994).

Thomas Kurian et al., "Grid-generated turbulence revisited," Fluid Dyn. Res., vol. 41, pp. 021403-1-021403-32 (2009).

R. D. Mehta, "Turbulent Boundary Layer Perturbed by a Screen," AIAA Journal, vol. 23, No. 9, pp. 1335-1342 (Sep. 1985 ).

Shunichi Tsuge, "Effects of flow contraction on evolution of turbulence," Phys Fluids, vol. 27, No. 8, pp. 1948-1956 (Aug. 1984).

Matthew L. Brown et al., "Turbulent flow in converging channel: effect of contraction and return to isotropy," J. Fluid Mech., vol. 560, pp. 437-448 (2006).

Nicholas C. Ovenden et al., "Vortices and flow reversal due to suction slots," Phil. Trans. R. Soc. A, vol. 363, pp. 1199-1208 (2005).

Masahito Asai et al., "Growth and breakdown of low speed streaks leading to wall turbulence,". J. Fluid Mech., vol. 586, pp. 371-396 (2007).

P. J. D. Roberts et al., "Boundary layer instability induced by surface suction," Physics of Fluids, vol. 13, No. 9, pp. 2543-2552 (Sep. 2001).

Carlo Cossu et al., "On Tollmien-Schlichting-like waves in streaky boundary layers," European Journal of Mechanics B/Fluids, vol. 23, pp. 815-833 (2004).

P. Balakumar et al., "Optimum Suction Distribution for Transition Control," Theoret. Comput. Fluid Dynamics, vol. 13, pp. 1-19 (1999).

Koen Steffens, "Investigation on the pressure loss over the suction skin and the maximum suction threshold for use in Laminar Flow Control systems," Master's Thesis, Delft University of Technology, pp. 1-xviii (Sep. 2005).

J.E. Ellis et al. "Laminar and Laminarizing Boundary Layers by Suction Through Perforated Plates," 2nd European Forum on Laminar Flow Technology, Ref: APT591-10-0265, 11 pages, Bordeaux (Jun. 1996).

Christopher Davies et al., "Instabilities in a plane channel flow between compliant walls," J, Fluid. Mech., vol. 352, pp. 205-243 (1997).

Chinese Office Action dated Oct. 24, 2013 in corresponding Chinese Patent Application No. 201110316530.3.

* cited by examiner

Fig. 8
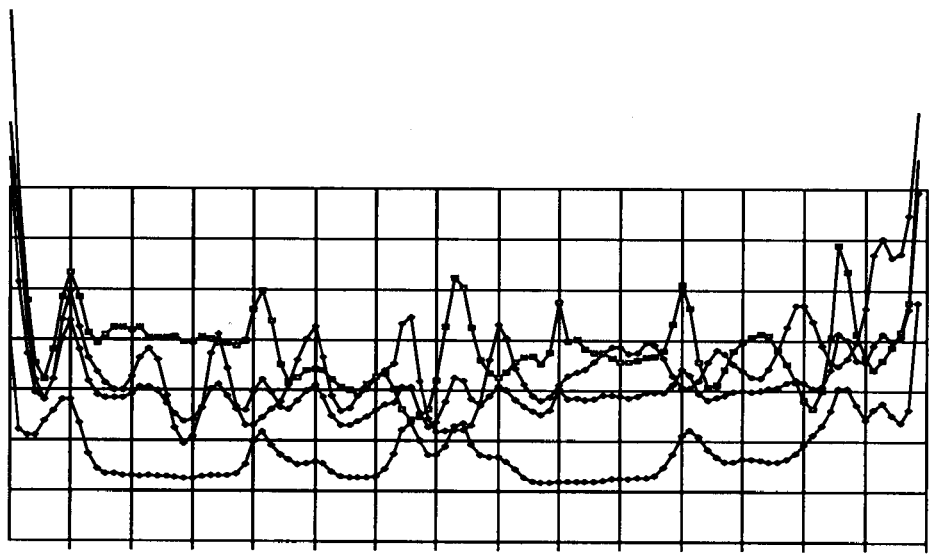
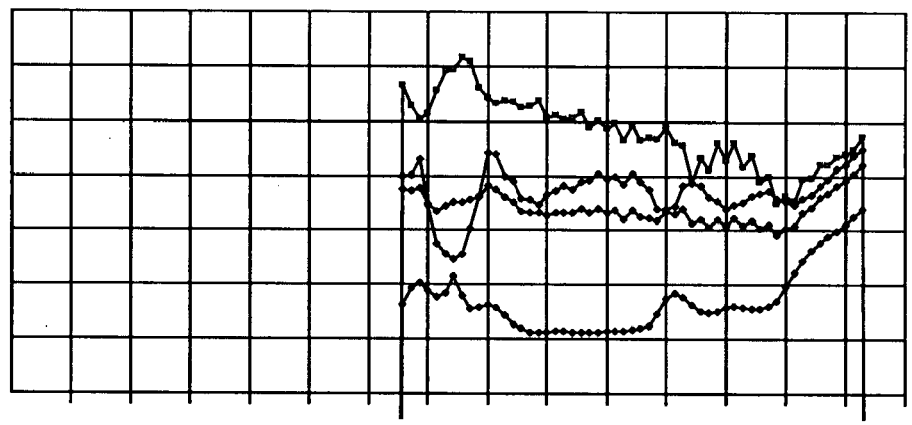
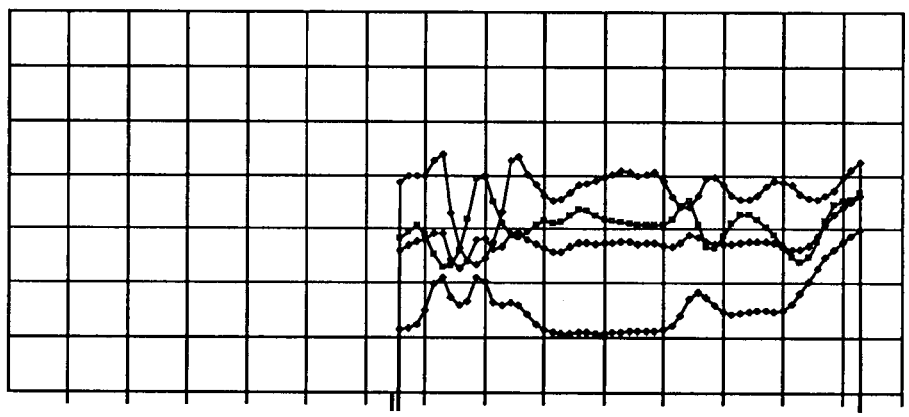

GAS MANIFOLD, MODULE FOR A LITHOGRAPHIC APPARATUS, LITHOGRAPHIC APPARATUS AND DEVICE MANUFACTURING METHOD

This application claims priority and benefit under 35 U.S.C. §119(e) to U.S. Provisional Patent Application No. 61/394,444, entitled "Gas Manifold, Module for a Lithographic Apparatus, Lithographic Apparatus and Device Manufacturing Method", filed on Oct. 19, 2010. The content of that application is incorporated herein in its entirety by reference.

FIELD

The present invention relates to a gas manifold, a module for a lithographic apparatus, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In IC fabrication, the continuing improvements in microprocessor speed, memory packing density and low power consumption for micro-electronic components have led to a continuing decrease of size of the patterns that are transferred from the patterning device to the substrate by the lithographic apparatus. As the size of an integrated circuit is reduced and its density increases, however, the CD (critical dimension) of its corresponding patterning device pattern approaches the resolution limit of the lithographic apparatus. The resolution for a lithographic apparatus is defined as the minimum feature that the apparatus can repeatedly expose on the substrate. Various techniques, known as resolution enhancement techniques, have been applied in order to extend the resolution limit of the lithographic apparatus.

One technique to improve resolution is off-axis illumination. With this technique, the patterning device is illuminated with radiation at a selected non-perpendicular angle, which may improve resolution and may improve the process latitude by increasing the depth of focus and/or contrast. The angular distribution at the patterning device plane, which is an object plane, corresponds to a spatial distribution in a pupil plane of the optical arrangement of the lithographic apparatus. Typically, the shape of the spatial distribution in a pupil plane is referred to as an illumination mode. One known illumination mode is annular, in which the conventional zero order spot on the optical axis is changed to a ring-shaped intensity distribution. Another mode is multipole illumination in which several spots or beams are produced which are not on the optical axis. Examples of multipole illumination modes are dipole, comprising two poles and quadrupole, comprising four poles.

SUMMARY

For illumination modes such as dipole and quadrupole, the size of the poles in the pupil plane can be very small compared to the total surface of the pupil plane. Consequently, all of the radiation used to expose the substrate traverses the various optical elements at or near the pupil planes at the locations of these poles only. A fraction of the radiation traversing one or more optical elements (e.g., one or more lenses) is absorbed by the element(s). This leads to a non-uniform heating of the element(s) by the radiation beam, resulting in a local change in refractive index and a deformation of the element(s). The local change in refractive index and deformation of the element(s) results in a distorted aerial image as projected by the projection system onto the resist layer.

U.S. Pat. No. 7,525,640, the entirety of which is hereby incorporated by reference, proposes a solution. In this solution an optical component is provided transverse to and in the path of the beam of radiation. The optical component comprises a first plate with an individually addressable electrical heating device configured locally to heat the optical element. The refractive index of the optical element can be changed by changing its temperature at local positions. The optical component further comprises a further plate in parallel to the first plate. A flow of gas is provided between the two parallel plates. This reduces the transfer of heat within the optical member in a direction perpendicular to the radiation beam. Otherwise heat may be transferred in the optical member from positions with a high temperature to positions with a lower temperature due to conduction which reduces the gradient of the change in refractive index achievable. Additionally, providing the gas at a temperature lower than ambient temperature, two-sided correction (i.e. heating and cooling) is obtainable.

It is desirable, for example, to provide a gas manifold in which one or more measures are taken to stabilize a gas flow provided between two parallel plates of an optical component of a lithographic apparatus.

According to an aspect, there is provided a gas manifold to direct a gas flow between two substantially parallel plates of an optical component of a lithographic apparatus, the gas manifold comprising: an inlet to provide a gas flow to the gas manifold; a diffuser downstream of the inlet to provide a pressure drop in the gas flow; a flow straightener, downstream of the inlet, to straighten the flow of gas out of the diffuser; a contractor, downstream of the flow straightener, to reduce the cross sectional area through which the gas flow flows; and an outlet, downstream of the contractor, to provide the gas flow to the two plates.

According to an aspect, there is provided a device manufacturing method comprising: projecting a patterned beam of radiation onto a target portion of a substrate using a projection system; locally changing an optical path length of the beam of radiation using two substantially parallel plates arranged transverse to and in the path of the beam of radiation, at least one of the plates being heated locally; and providing a gas through a diffuser, a flow straightener, a contractor and between the two plates.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 illustrates the effect of the presence of projections on a wall of the gas manifold.

DETAILED DESCRIPTION

Figure 1:
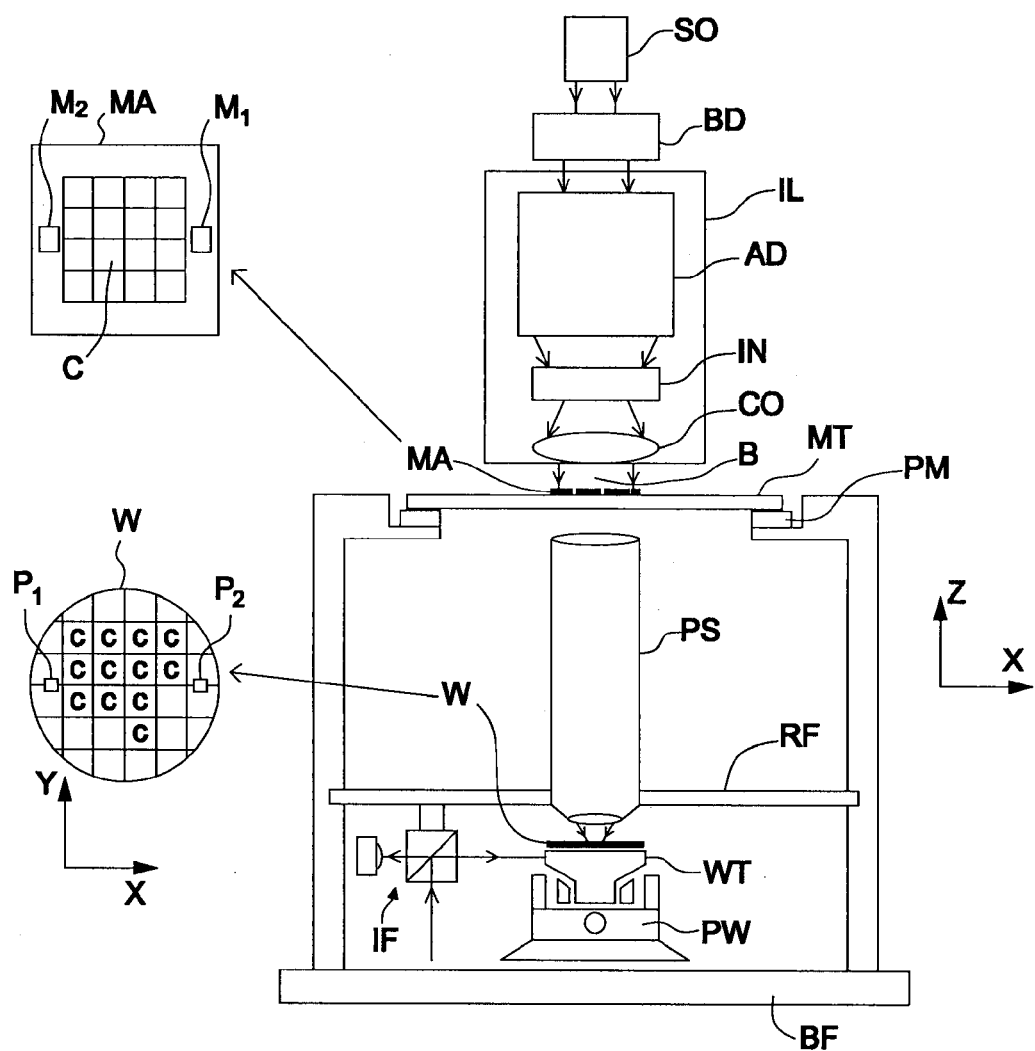
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, catadioptric, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The intensity distribution of the radiation beam may comprise a plurality of poles, defining the portion of the cross-section of the pupil plane through which substantially all radiation of the radiation beam traverses the pupil plane. In the following description, the intensity distribution of the radiation beam in a pupil plane is referred to as an illumination mode. In an embodiment the intensity distribution is a dipole illumination mode (2 poles). In an embodiment the intensity distribution is a quadrupole illumination mode (4 poles).

As the radiation beam traverses a optical element (e.g., a refractive lens), a small portion of the radiation beam is absorbed by the element. The absorption of the radiation beam by the element causes the element to heat up. Heating of the element results in a change in refractive index of the element at the location of absorption and a deformation of the element. For an element positioned at a location where the radiation beam traverses the element uniformly, this absorption results in a uniform heating of the element and a uniform change in refractive index. This can be detrimental, especially for non-parallel elements (e.g. convex or concave elements). For an element positioned at or near a pupil plane, the portion of the cross-section of the element through which the radiation beam traverses the element is dependent on the applied illumination mode. For an illumination mode such as dipole or quadrupole, the element absorbs radiation non-uniformly across the surface of the element, causing a non-uniform change in refractive index and deformation of the element. The local changes in refractive index and deformation of one or more elements in the projection system result in a change in optical path length of different portions of the radiation beam traversing the elements. The changes in optical path length differences causes the portions of the radiation beam to recombine into an aerial image at substrate level that is distorted with respect to the object image at patterning device level due to an optical path length difference between the recombining portions of the radiation beam. An example of an imaging parameter that is negatively affected by this difference is the field position dependent focus offset.

Figure 2:
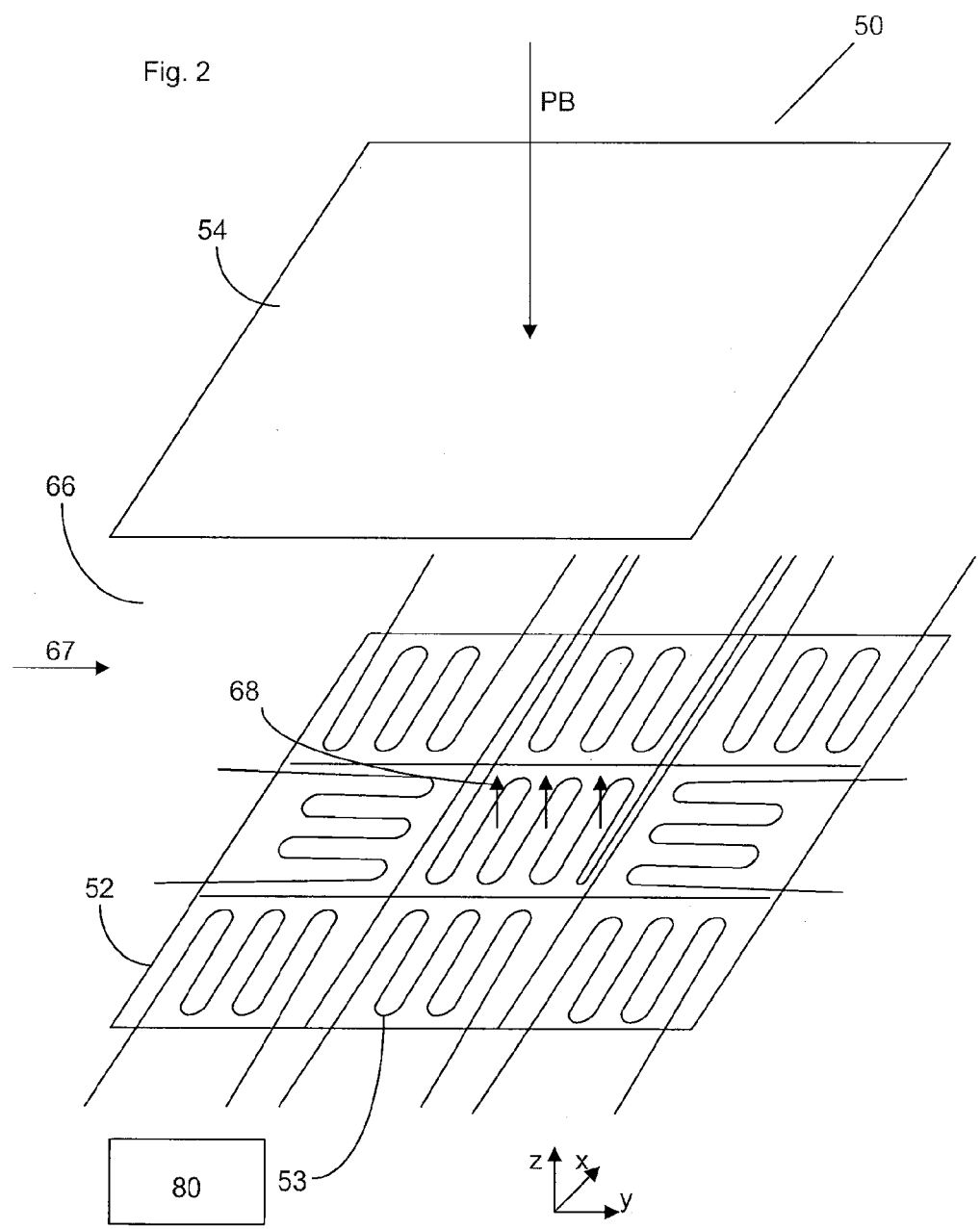
FIG. 2 illustrates, in perspective view, an optical component of a lithographic apparatus comprising two parallel plates.

FIG. 2 shows an embodiment of an optical component 50 comprising two parallel plates 52, 54. At least one parallel plate 52 comprises electrical heating devices 53 in the form of conductors, for example meandered conductors. The electrical heating devices 53 are electrically connected to a control unit 80 and are separated from each other. The control unit 80 addresses each consecutive electrical heating device of the nine electrical heating devices using a known time multiplexing addressing technique to generate a desired amount of heat in the associated optical element. The optical component 50 may comprise any number of electrical heating devices. The optical component 50 thereby allows the creation of locally warmer and cooler areas in the cross section of the projection beam PB. This can counter the optical element heating elsewhere by off-setting optical element heating (as a result of the passage of the projection beam PB through a local area of the optical element) elsewhere.

The transfer of heat within the optical component 50 in a direction perpendicular to the radiation beam PB is desirably minimal. For this purpose, a channel 66 confined by the plates 52 and 54 is arranged to create a heat transfer within the optical component 50 substantially in a direction parallel to the radiation beam PB as indicated by arrows 68. This is achieved by guiding a fluid, for example a (ultra-high-purity) gas such as filtered ambient air or any other non-reactive gas, such as a gas comprising substantially $N_2$ or He, from a supply through the channel 66 as indicated by arrow 67. In an embodiment the gas is kept at a lower temperature than the optical component 50. Typically, the channel 66 will have dimensions in X and Y directions comparable to the size of the optical component 50 and a height in Z-direction of less than 10 mm. The temperature of the gas may be kept substantially constant using a known temperature control device arranged in between the gas supply 14 (shown in FIG. 3) and the optical arrangement. The gas may be reused by enabling a circulation loop wherein the gas after passing the optical component is transported back to the gas supply 14.

To enable two-sided correction and keep the optical component as a whole at a pre-defined average temperature, a cooling power bias is used. This is supplied by means of the (ultra-high-purity) cooling gas flow of several hundreds of liters per minute. The gas is supplied via a gas manifold 10 illustrated in FIG. 3. The gas is provided to the gas manifold 10 via an inlet 12. Gas is provided to the inlet from the gas supply 14. The velocity of gas in the hose between the gas supply 14 and the inlet 12 is bound to a certain allowable upper limit.

Figure 3:
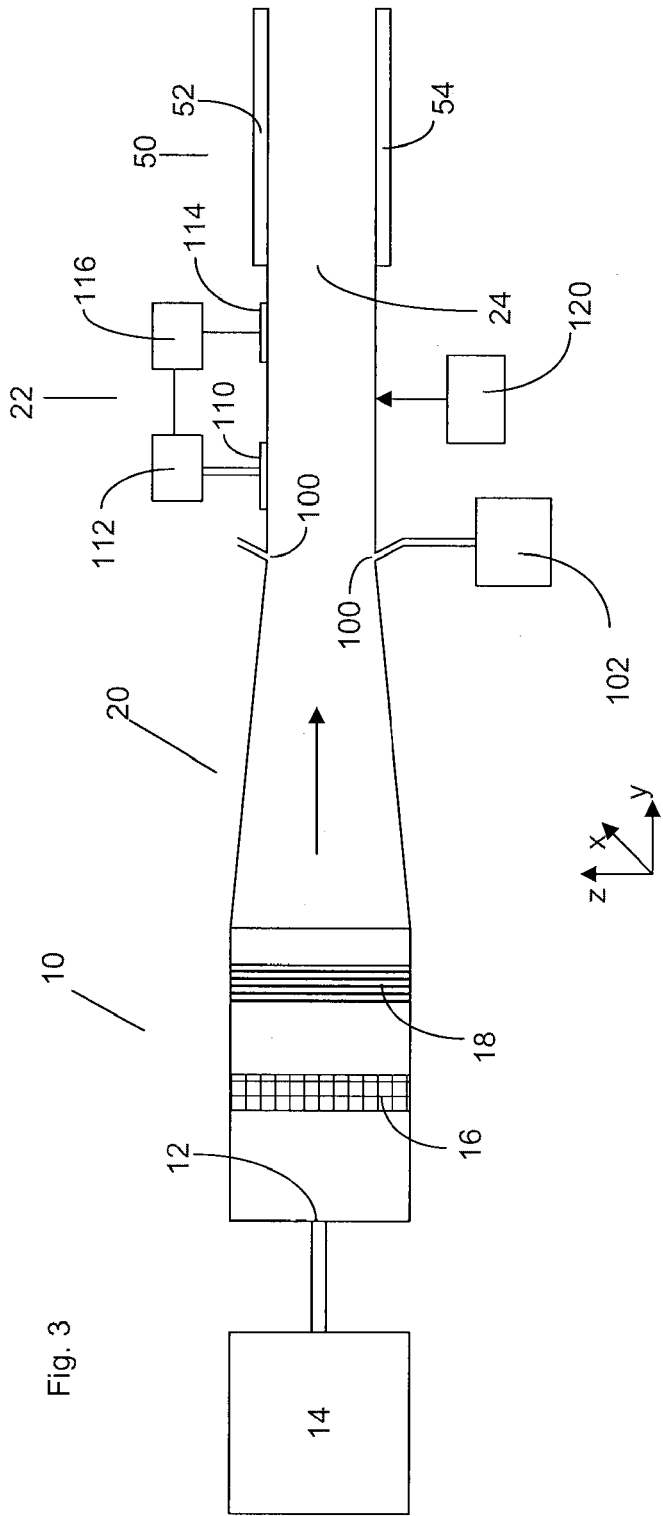
FIG. 3 illustrates a gas manifold, optical component and gas flow path of an embodiment of the present invention.

Turbulence in the flow of gas between the two parallel plates 52, 54 can be detrimental to the wavefront stability and thereby the functionality of the optical component 50. As illustrated in FIG. 3, the gas manifold 10 comprises, downstream of the inlet 12, a diffuser 16. The diffuser 16 may be in the form of a porous (metal) plate to provide a pressure drop (of several bar). This helps keep the upstream pressure high thereby allowing a lower velocity gas at higher pressure from the gas supply 14. Additionally, the diffuser 16 results in a substantially uniform flow rate of gas over its cross-sectional area out of the diffuser 16 on its downstream side.

Downstream of the diffuser 16 is a flow straightener 18. The flow straightener 18 straightens the flow of gas so that the gas all flows in substantially parallel directions. The flow straightener 18 damps fluctuations perpendicular to the flow direction. The flow straightener 18 increases performance by reducing the magnitude or occurrence of spanwise temperature modulations. The flow straightener 18 comprises a plurality of passages for the flow of gas therethrough. In one embodiment the flow straightener 18 has an open area ratio (the ratio of
  passageway to material in cross-section) of greater than 0.5, desirably greater than 0.55 or even larger than 0.6. In an embodiment, the flow straightener is a honeycomb flow straightener. For a honeycomb flow straightener, the open area ratio is typically 0.5-0.6 with a relatively small hole diameter. An optimal length L for the passages through the flow straightener 18 relative to the hydraulic diameter D of the passages is typically between 5 and 15, desirably between 8 and 12. The hydraulic diameter (calculated as four times the cross sectional area of a passage divided by the perimeter length of the passage) is between 0.5 and 1.5 mm. A honeycomb flow straightener has passages with a hexagonal cross section.

In an embodiment one or more permeable membranes (e.g. a cloth) spanned over the flow area may be upstream or downstream (or both) of the flow straightener 18. Such permeable membranes help make the flow velocity profile more uniform, like the diffuser 16, but do not result in such a large pressure drop.

Downstream of the flow straightener 18 is a contractor 20. The contractor 20 reduces the intensity of turbulence, if any, in the flow of gas through it. This is a result of increasing the velocity of the gas, so that relative velocity fluctuations are lower and also because of a phenomenon known as vortex tube stretching. Vortex tube stretching is the acceleration of the decay of larger flow structures. The cross sectional area of the contractor 20 through which the gas flow flows, becomes smaller further downstream. This reduces the intensity of turbulences, if any, in the gas flow.

In an embodiment the contractor 20 is a planar contractor. That is, the contraction only occurs in one direction (the z direction) and there is no contraction in the orthogonal direction perpendicular to the flow direction (the x direction as illustrated). This means that the size of the contractor 20 in z-direction is reduced further downstream. The size in the x-direction does not change. A planar contractor 20 has an advantage that it takes up less space than a 3-D contractor. In an embodiment the contractor 20 may also contract in the x direction (i.e. be a 3-D contactor).

An inlet section 22 is provided downstream of the contractor. In an embodiment the inlet section 22 has a constant cross-sectional shape. In an embodiment the inlet section 22 has converging (in the z-axis) upper and lower (flat) plates to help further stabilize the flow. An outlet 24 is provided at the end of the gas manifold downstream of the diffuser 16, flow straightener 18, contractor 20 and inlet section 22. The outlet 24 is connected to the optical component 50. The gas flow then passes into the channel 66.

Figure 4:
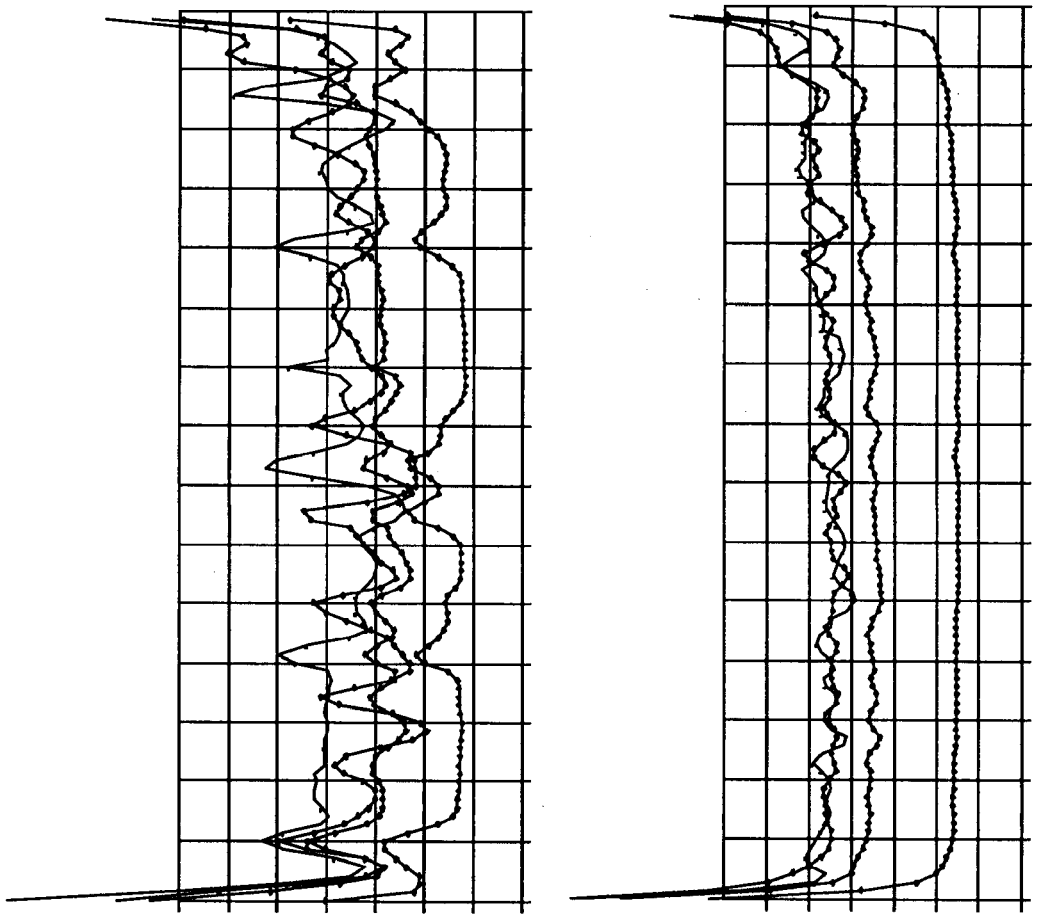
FIG. 4 illustrates temperature variations for contractors with different contraction ratios.

A contraction ratio (the ratio of the cross sectional area at an inlet side of the contractor 20 to the cross sectional area of the outlet side of the contractor 20) of 4-6 may be used. This may result in the largest turbulence reduction, at least for axisymmetric contraction. However, the planar contraction of the gas manifold of FIG. 2 may perform better with a contraction ratio of between 1.5 and 3, or between 2 and 30. The graphs in FIG. 4 illustrate this. In FIG. 4 the left hand graph shows variation in temperature (on they axis) with location (on the x axis). Temperature variation over the width of the gas manifold (in a direction perpendicular to the direction of gas flow) at locations at the top, bottom and center on the outlet side 24 of the inlet section 22 is shown. An average temperature is also illustrated. The top graph is for a contractor with a contraction ratio of 5 whereas the bottom graph shows the results with a contractor with a contraction ratio of 2. An additional advantage of using a lower contraction ratio is that this takes up less space in the gas manifold and the overall dimension of the apparatus in the z direction is kept small.

In FIG. 4 the temperature variation in the top graph is, for a center portion, about 0.8° whereas in the bottom graph the same variation is closer to 0.1° C. This shows that using a contractor with a contraction ratio of 2 performs better than one with a contraction ratio of 5.

Figure 5:
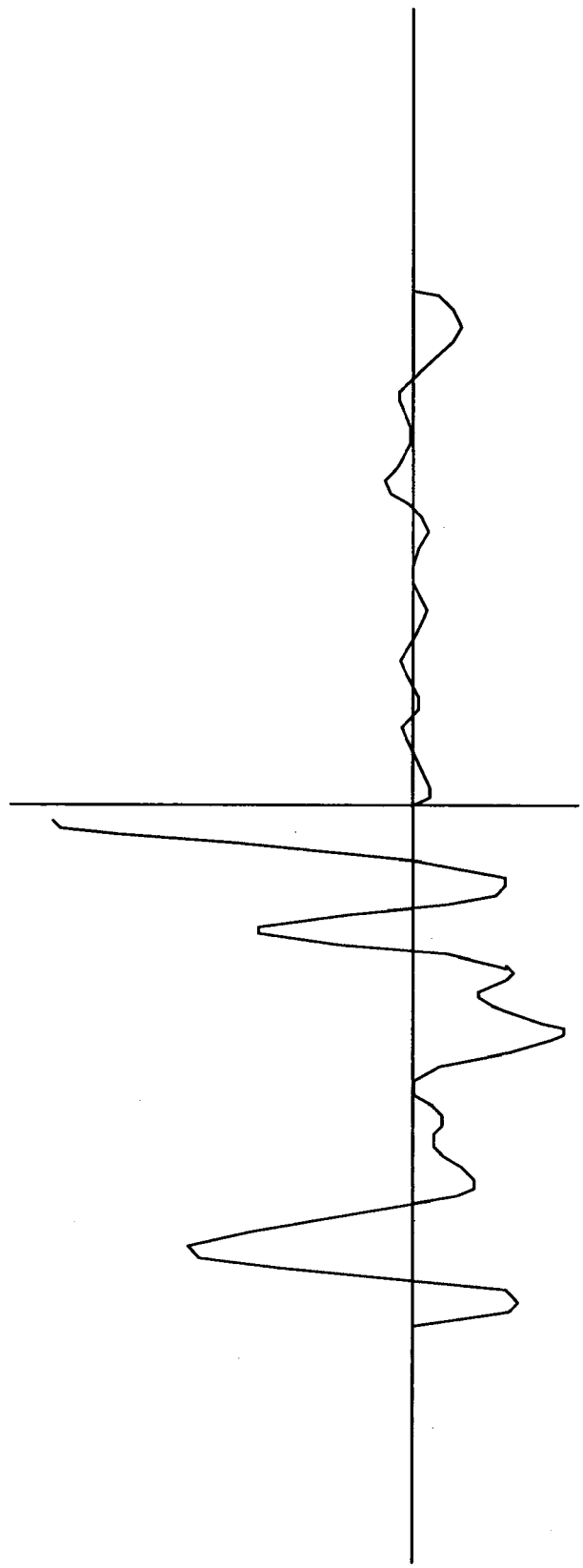
FIG. 5 illustrates optical path length variations for a gas manifold with and without a flow straightener.

FIG. 5 shows the effect of the presence of the flow straightener 18 in the gas manifold 10. The graphs show the results of optical path length variation on they axis versus position on the x axis (in the same way as FIG. 4). On the left hand side of FIG. 5 the results are plotted for a gas manifold 10 without a flow straightener 18. On the right hand side of FIG. 5 the results are plotted for the same conditions except that a honeycomb flow straightener with a hydraulic diameter of 0.9 mm and a length of 12 mm downstream of the diffuser 16. As can be seen, the magnitude of optical path length fluctuations is greatly reduced due to the presence of the flow straightener even though the parameters of the flow straightener are not yet optimized.

The improvement of the gas flow between the two plates 52, 54 using the above described gas manifold with diffuser 16, flow straightener 18 and contractor 20 is marked. However, turbulence may still exist for very high flow rates in the flow of gas and fundamental flow in stabilities such as Görtler vortices and Klebanoff modes can still be present. These instabilities can result in stream-wise oriented optical phase streaks (a span-wise optical path length modulation) in the optical area. This can lead to functional limitations of the optical component 50. The presence of the streaks may be due to a span-wise temperature modulation present in the cooling gas. This modulation is due to vortex streaks developing in the gas close to the walls of the gas manifold 10 defining the flow path of the gas through the gas manifold. This results in a non-uniform heat pickup at the walls.

The formation of the streaks may occur in this type of flow when the Reynolds number (Re) is in the transitional or low-turbulent phase (Re being between 4,000 and 6,000) and when the level of disturbances is high enough to induce them and allow their growth, but not too large to cause breakdown of coherent structures. The boundary conditions and cooling power requirements of the gas manifold 10 however dictate a geometry and flow velocity that result in this transitional or low-turbulence Reynolds number when air or a similar gas is used as the cooling medium. Further measures can be taken in the gas manifold 10 to address these issues as described below.

One measure which addresses the issue of the presence of streaks removes disturbances originated in the contractor 20. This is achieved by providing an opening 100, for example at an outlet side of the contractor 20. An underpressure is applied to the opening 100 by an underpressure source 102. The underpressure promotes the removal of a boundary layer of gas from a wall of the gas manifold 10, in particular from the wall of the contractor 20. The opening 100 may be alternatively or additionally provided in a wall of the inlet section 22 or at an outlet side of the inlet section 22. At a position in the inlet section 22 the opening 100 would continuously delay disturbance amplification and thereby help in the prevention or reduction of streak formation.

The opening 100 may be in the form of a slit or a plurality of holes which extend(s) across the width of the gas manifold (e.g. in a direction perpendicular to the direction of gas flow). In an embodiment the opening 100 is in the form of a slit and has a uniform width.

In an embodiment suction is generated by an underpressure source 102 connected to the opening 100 of the order of a few hundred pascal, for example between 200 and 1,000 pascal. This is effective to remove the developing boundary layer at the end of the contractor 20 and thereby remove disturbances generated in the gas manifold 10 before they can trigger streak formation in the inlet section 22 or in the gap between the two plates 52, 54.

In an embodiment the underpressure along the length of the slit shaped opening 100 is uniform. The gas flow rate through the opening 100 is in the region of a few percent, for example between 1 and 10%, of the flow through the gas manifold 10.

Figure 6:
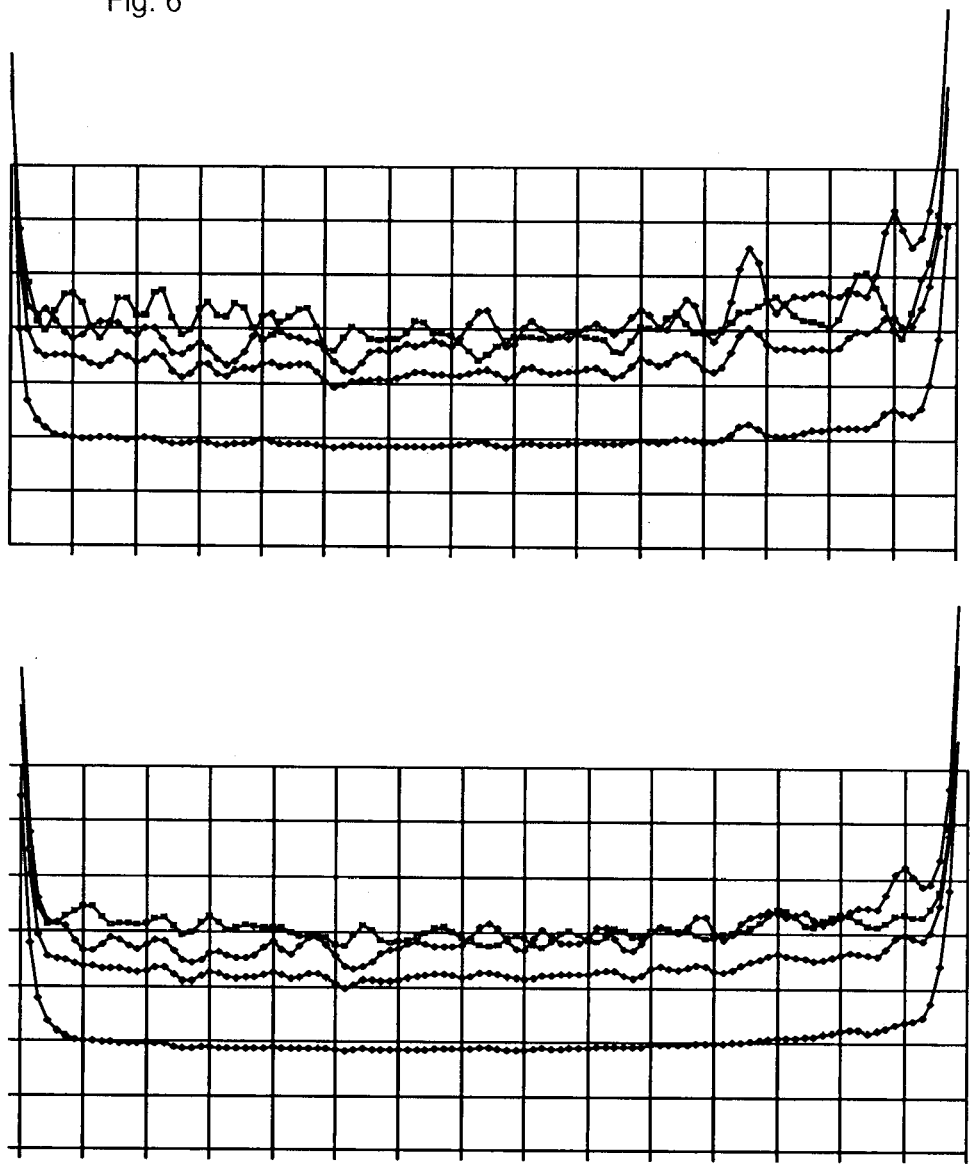
FIG. 6 illustrates temperature variations for gas manifolds with and without an opening for the application of an underpressure.

FIG. 6 illustrates the difference in results generated by a gas manifold 10 with and without an opening 100 connected to a underpressure 102 (generating an underpressure of 300 Pa). The graphs show results in the same format as FIGS. 4 and 5 and it can clearly be seen that the temperature variation in the bottom graph which is for the situation where an opening 100 is provided, shows an improvement over the case where no such opening is provided (in the top graph).

In an embodiment part of the wall of the gas manifold 10, for example part of the wall of the contractor 20 and/or of the inlet section 22, which defines the flow path for the gas flow can be provided as a porous wall 110. An underpressure can be applied by an underpressure source 112 to a side of the porous wall 110 opposite to the gas flow. The underpressure developed by the porous wall has a stabilizing effect on the boundary layer of the gas flow. This can help in reducing or even preventing the formation of streaks in the gas manifold 10. The porous wall 110 may be provided at one or more discrete locations on one or both sides of the flow path or all along the length of the contractor 20 and/or inlet section 22.

The porous wall 110 may comprise a porous member or may comprise a member with an array of holes in it. A hole diameter of 400 µm or less, for example 200 µm (or less) and/or a pitch of 4 mm or less or 2 mm (or less) may be suitable. Further information regarding such an embodiment may be found in: D. G. MacManus and J. A. Eaton, "Measurements and analysis of the flow field induced by suction perforations", J. Fluid Mech., Vol. 417, p. 47-75 (2000); J. Goldsmith, "Critical laminar suction parameters for suction into an isolated hole or a single row of holes", Northrop Aircraft Report no BLC-95 (1957); and D. G. MacManus and J. A. Eaton, "Flow physics of discrete boundary layer suction-measurements and predictions", J. Fluid Mech., Vol. 417, p. 47-75 (2000), each of which is incorporated in its entirety by reference.

In one embodiment a sensor 114 to sense streamwise shear stress at or adjacent the porous wall 110 is provided. A controller 116 can use this information, (for example in a feedback or feedforward way) to control the underpressure source 112 (for example by switching one or more valves). In this active control embodiment (which may include generating an overpressure), optical streak control may be achieved. Examples of sensors and a system incorporating such measures can be found in: A. Elofsson, M. Kawakami, P. H. Alfredsson, "Experiments on the stability of streamwise streaks in plane Poiseuille flow", Physics of Fluids, Vol. 11, No. 4 (1999); and F. Lundell and P. H. Alfredsson, "Experiments on control of streamwise streaks", European Journal of Mechanics B/Fluids, Vol. 22, pp. 279-290 (2003), each of which is hereby incorporated in its entirety by reference.

In an embodiment the gas manifold 10 is configured to introduce disturbances in the gas in the manifold through vibrations. In this way a dynamic equilibrium can be achieved and the formation of streaks can be suppressed and/or prevented. In one embodiment the vibrations are introduced in a passive way and in another embodiment the vibrations are induced in an active way.

In the embodiment which introduces vibrations in a passive way, one or more walls (or part of one or more walls) of the gas manifold 10, for example a wall of the contractor 20 and/or inlet section 22, are made flexible or compliant (as opposed to rigid). This idea is discussed in: P. W. Carpenter, C. Davies and A. D. Lucey, "Hydrodynamics and compliant walls", CURRENT SCIENCE, Vol. 79, No. 6 (Sep. 25, 2000); and J. Hoepffner, A. Bottaro and J. Favier, "Mechanisms of non-modal energy amplification in channel flow between compliant walls", Journal of Fluid Mechanics (2009), each of which is hereby incorporated in its entirety by reference. The wall vibrations are triggered by the flow of gas past the wall. The vibrations introduce additional disturbances into the boundary layer which may disrupt the process of wave amplification which ultimately leads to streak formation. Alternatively or additionally, the flexible wall may be configured effectively to dampen out disturbances present in the boundary layer before they can trigger streak formation. In one embodiment the flexible wall is comprised of a polymeric material, for example rubber (e.g. latex, silicon etc), Viton fluoroelastomer, a fluoroelastomer, PFA fluoropolymer, Teflon fluoropolymer, styrene-butadiene rubber, composites, etc. The stiffness of the walls is chosen such that the flow of gas in the manifold leads to the formation of vibrations. Carpenter, "Instabilities in a plane channel flow between compliant walls", JFM, 1997, part I and II, which is hereby incorporated in its entirety by reference, discusses how the wall stiffness can be chosen. In an embodiment, the wall may have a spring stiffness of about $1\times10^{-4}$ to $1\times10^{-3}$ N/m$^3$, a flexural rigidity of about $1\times10^{-5}$ to $1\times10^{-4}$ Nm and an area density of $1\times10^{-3}$ to $2\times10^{-2}$ kg/m$^2$.

In an active embodiment, an actuator 120 may be provided for inducing vibrations in the z direction of a wall, or part of a wall or both walls which are in the x-y plane. A wall vibration can significantly influence the flow behavior, especially in the transitional range of a boundary layer. See, for example, M. R. Jovanovic, "Turbulence suppression in channel flows by small amplitude transverse wall oscillations", Phys. Fluids, Vol. 20, 014101 (2008), which is hereby incorporated in its entirety by reference The actuator should be configured to satisfy the following equation:

$$W=2\alpha \sin(\omega t),$$

where W is the wall speed, α an amplitude scaling factor and ω the frequency. For optimal disturbance control, ω should be chosen such that $\omega=\Omega^*v/\delta^2$ with v the kinematic viscosity of the gas, Ω being a frequency scaling factor and equal to about 17.6 and δ equal to half the width of the channel. This means ω≈10-20 Hz or 15 Hz. At the same time the amplitude of the vibrations should be about 2-5% of the incoming flow speed (or in other words: α≈0.01-0.025 times the flow velocity).

Figure 7:
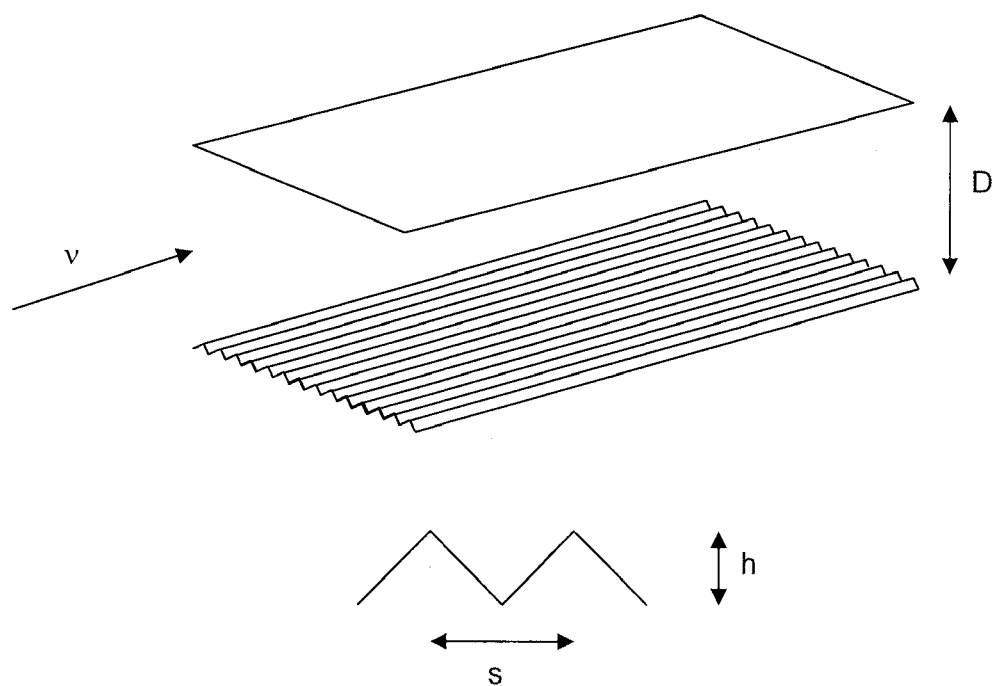
FIG. 7 illustrates schematically projections which may be used on a wall of the gas manifold.

In an embodiment, a plurality of elongate projections is provided on a wall of the gas manifold 10 defining the flow path for the gas flow. For example, the plurality of elongate projections can be provided on walls of the contractor 20 and/or inlet section 22. The plurality of elongate projections disrupts the formation of streaks or reduces their coherence once they are formed. This does not introduce excessive additional turbulence or significantly affect the cooling power. FIG. 7 illustrates schematically a plurality of projections formed on a wall of the inlet section 22. The walls of the inlet section 22 are separated by distance D.

The projections are elongate in the direction of gas flow. In cross-section the projections have a triangular shape. However, any shape can be used. The presence of the projections weakens streamwise vortices and inhibits spanwise temperature modulation formation. This happens because of the effect of secondary vortices at the projection tips. If a projection height h (e.g. the amount the projections project into the flow path) is between 0.2 and 1.0 mm and the pitch s between projections is between 0.5 and 2.0 mm the secondary vortices' motion is effectively weakening the streamwise vortices, thereby reducing or preventing their amplification. This is described in detail in S. J. Lee and S. H. Lee, "Flow Field Analysis of a Turbulent Boundary Layer Over a Riblet Surface", Exp in Fluids, Vol. 30, pp. 153-166 (2001), hereby incorporated in its entirety by reference.

An optimum may be for a riblet spacing s+=suτ/v comprised between 10 and 20 and for a h between 0.5 s and 1 s. In the definition of s+, v is the kinematic viscosity of the gas and uτ is the shear velocity. The latter is defined as (τw/ρ)0.5, with τw the wall shear stress and ρ the gas density. For the gas manifold 10, this yields a projection geometry of about s≈1 mm and h≈0.5 mm.

Suppression of the spanwise temperature modulation can be achieved when the projections are relatively small (e.g. s=1 mm and h=0.5 mm). Coarser projections (e.g. s=2 mm and h=1 mm) may tend to introduce a superimposed profile of their own. Typically s may be between 0.5 and 2.0 mm and h between 0.25 and 1 mm.

FIG. 8 illustrates the effect of the projections. The conditions are the same as those of FIG. 4. The top graph is for no projections. The bottom graph is for fine (e.g., optimum) projections and the middle results are with coarse projections. As can be seen, the amplitude of temperature variations is decreased by use of projections.

As described above, formation of streaks leading to phase ripples (i.e. a spanwise modulation in the optical phase) is strongest in a particular range of Reynolds number, around the theoretical value of turbulent transition of Re≈6000 (for plane Poiseuille flows).

Establishing the desired cooling power with air involves a large flow velocity, leading to the transitional Reynolds number referred to earlier. It is possible to employ different gases with higher thermal conductivities to enable a reduction of the flow velocity for the same cooling power. The two most prominent candidates in terms of this property are helium and hydrogen, the latter of which may be excluded based on other properties.

The thermal conductivity of helium is about 6 times higher than that of air, which means that the cooling power increases by this same factor 6. This can be deduced by recalling that the Nusselt number (Nu) is the ratio between the convective and conductive heat transfer:

$$Nu = \frac{hL}{k},$$

in which h is the convective heat transfer coefficient, k the thermal conductivity of the medium and L a characteristic length. Clearly, for the same Nusselt number, the convective heat transfer the optical component 50 requires increases linearly with the thermal conductivity.

Calculations in which some adaptation of the Gnielinski equations has been used yielded a linear or close to linear relation between the Reynolds and Nusselt numbers. It shall be noted here, due to its explicit presence in the calculation of the Nusselt number, that the Prandtl number difference is only about 5% and in the context of the tremendous differences in the other gas properties can thus be neglected in the first-order approximation. Thus, there exists a somewhat linear relation between the convective heat transfer coefficient and the Reynolds number and thus, by extension, the mass flow (neglecting the difference in dynamic viscosity of about 10%, in the context of the much larger differences in the other properties):

$$Re = \frac{\rho V D_h}{\mu} = \frac{V D_h}{v} = \frac{\dot{m} D_h}{vA},$$

in which ρ is the fluid density, V the velocity, $D_h$ the hydraulic diameter, μ the dynamic viscosity, v the kinematic viscosity, m the mass flow rate and A the flow area.

Using helium instead of air allows for a significant reduction in mass flow rate (or, equivalently, Reynolds number) while still meeting the cooling power requirements for an unchanged channel geometry (helium's 5 times higher specific heat capacity counters the increased heat pick-up per gram of medium). The flow regime thereby is a much more stable one, in which instabilities should be much less pronounced. As a consequence, the span-wise temperature modulation is of much lower amplitude. Furthermore, because of the fact that the temperature dependency of helium's refractive index is much lower than for air, any temperature ripple will translate to a much lower optical phase ripple.

Figure 9:
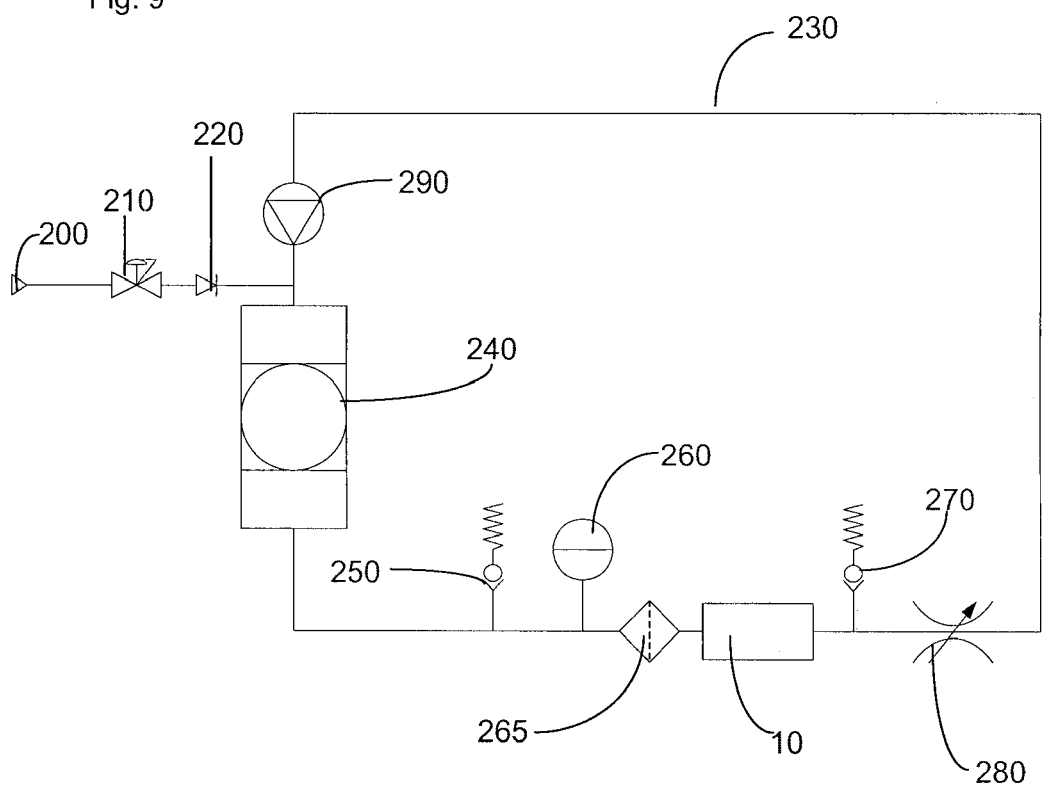
FIG. 9 illustrates schematically a helium supply system.

A disadvantage of helium is the cost associated with helium and to solve that problem, the supply system could be a recirculating one. FIG. 9 presents a very basic sketch of such a system, in which no system safeties or system control is depicted.

FIG. 9 illustrates schematically a system including a gas source of helium 200, a pressure regulator 210 and a check valve 220 delivering a source of helium into a recirculation system 230 to compensate for unavoidable leakage. A regenerating purifier 240 is provided downstream of the position at which the helium is provided to help ensure ultra-high purity conditions. An overpressure relief valve 250 is provided as well as a mass flow controller 260. Downstream of the mass flow controller 260 is implemented a particle filter 265 before the gas is provided to the gas manifold 10. A capturing device is provided to capture gas exiting the optical component 50 and the gas then continues around the flow path 230 through an overpressure relief valve 270, a variable restriction 280 which can be used to adjust pressure, through a compressor 290 back to the regeneration purifier 240.

As will be appreciated, any of the above described features can be used with any other feature and it is not only those combinations explicitly described which are covered in this application. Further, while refractive optical elements have been mostly discussed herein, the description here may also or instead by applied to reflective optical elements.

In an embodiment there is provided a gas manifold to direct a gas flow between two substantially parallel plates of an optical component of a lithographic apparatus. The gas manifold comprises an inlet, a diffuser, a flow straightener, a contractor and an outlet. The inlet is to provide a gas flow to the gas manifold. The diffuser is downstream of the inlet to provide a pressure drop in the gas flow. The flow straightener is downstream of the inlet, to straighten the flow of gas out of the diffuser. The contractor is downstream of the flow straightener, to reduce the cross sectional area through which the gas flow flows. The outlet is downstream of the contractor, to provide the gas flow to the two plates.

The contractor may be a planar contractor. The contractor may have a contraction ratio of between 1.5 and 3.

The open area ratio of the flow straightener may be larger than 0.5, larger than 0.55, or larger than 0.6. The flow straightener may comprise a plurality of passages for the passage of gas therethrough.

The plurality of passages may have a hydraulic diameter to length ratio of between 5 and 15, or between 8 and 12. The passages may have a hydraulic diameter of between 0.5 and 1.5 mm. The passages may be hexagonal, in cross-section.

The gas manifold may further comprise, between the contractor and the outlet, an inlet section comprising a passage of substantially constant cross-sectional shape.

A wall of the gas manifold may be configured to introduce disturbances in gas in the manifold through vibrations. The wall may be comprised of a polymeric material. The wall has a spring stiffness, flexural rigidity and/or area density such that the flow of gas in the manifold leads to formation of the vibrations.

The gas manifold may further comprise an actuator to generate the vibrations. The gas manifold may be configured to generate the vibrations at a frequency of between 10 and 20 Hz. The gas manifold may be configured to generate the vibrations to have an amplitude in meters of 0.01-0.025 times the gas flow velocity in meters/second.

The gas manifold may further comprise an opening in a wall of the gas manifold. The opening may be configured to apply an underpressure to promote removal of a boundary layer of gas from the wall of the gas manifold. The opening may be at an outlet side of the contractor. The opening may be in the form of a slit with uniform width and may extend across the gas manifold in a direction perpendicular to the direction of gas flow. The opening may be in the form of a plurality of holes which extend across the gas manifold in a direction perpendicular to the direction of gas flow.

The gas manifold may further comprise an underpressure source attached to the opening. The underpressure source may generate an underpressure of 200-1000 Pa.

The gas manifold may further comprise a porous wall defining a flow path for the gas flow. The porous wall may have an underpressure applied to it on a side opposite to the gas flow. The porous wall may have a plurality of holes in it with a diameter of 400 μm or less and/or a pitch of 4 mm or less. The porous wall may be part of the contractor and/or downstream of the contractor.

The gas manifold may further comprise an underpressure source attached to the porous wall.

The gas manifold may further comprise a sensor configured to sense streamwise shear stress at or adjacent the porous wall. The gas manifold may further comprise a controller configured to control the underpressure source according to a signal from the sensor.

The gas manifold may further comprise, on a wall defining a flow path for the gas flow, a plurality of elongate projections. The projections may elongate in the direction of gas flow.

The wall may be part of the contractor and/or downstream of the contractor.

The projections may project into the flow path by between 0.2 and 1.0 mm and/or have a pitch of between 0.5 and 2.0 mm.

In an embodiment there is provided a module for providing a gas flow between two substantially parallel plates of an optical component of a lithographic apparatus. The module may comprise the gas manifold as mentioned above.

The module may further comprise a gas source to provide gas to the inlet to be directed between the two plates. The gas source may be a source of helium.

The module may further comprise a capturing device configured to capture gas exiting from between the two plates.

The module may further comprise a recycling device configured to provide gas captured by the capturing device to the inlet.

In an embodiment there is provided a lithographic apparatus comprising a projection system, two substantially parallel plates and a gas manifold or a module. The projection system is configured to project a patterned beam of radiation onto a target portion of a substrate. The two substantially parallel plates are arranged transverse to and in a path of the beam of radiation. At least one of the plates comprises an individually addressable electrical heating device configured locally to heat the plate. A gas manifold or a module as described above, is to direct a gas flow between the two plates.

In an embodiment there is provided a device manufacturing method comprising projecting a patterned beam of radiation onto a target portion of a substrate using a projection system. The method further comprises locally changing an optical path length of the beam of radiation using two substantially parallel plates arranged transverse to and in the path of the beam of radiation, at least one of the plates being heated locally. The method further comprises providing a gas through a diffuser, a flow straightener, a contractor and between the two plates.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A gas manifold to direct a gas flow between two substantially parallel plates of an optical component of a lithographic apparatus, the gas manifold comprising:
   an inlet to provide a gas flow to the gas manifold;
   a diffuser downstream of the inlet to provide a pressure drop in the gas flow;
   a flow straightener, downstream of the inlet, to straighten the flow of gas out of the diffuser;
   a contractor, downstream of the flow straightener, to reduce the cross sectional area through which the gas flow flows; and
   an outlet, downstream of the contractor, to provide the gas flow to the two plates.

2. The gas manifold of claim 1, wherein the contractor is a planar contractor.

3. The gas manifold of claim 1, wherein the contractor has a contraction ratio of between 1.5 and 3.

4. The gas manifold of claim 1, wherein the open area ratio of the flow straightener is larger than 0.5.

5. The gas manifold of claim 1, wherein the flow straightener comprises a plurality of passages for the passage of gas therethrough.

6. The gas manifold of claim 1, further comprising, between the contractor and the outlet, an inlet section comprising a passage of substantially constant cross-sectional shape.

7. The gas manifold of claim 1, wherein a wall of the gas manifold is configured to introduce disturbances in gas in the manifold through vibrations.

8. The gas manifold of claim 7, wherein the wall is comprised of a polymeric material.

9. The gas manifold of claim 7, wherein the wall has a spring stiffness, flexural rigidity and/or area density such that the flow of gas in the manifold leads to formation of the vibrations.

10. The gas manifold of claim 7, further comprising an actuator to generate the vibrations.

11. The gas manifold of claim 1, further comprising an opening in a wall of the gas manifold, the opening configured to apply an underpressure to promote removal of a boundary layer of gas from the wall of the gas manifold.

12. The gas manifold of claim 11, further comprising an underpressure source attached to the opening, the underpressure source generating an underpressure selected from 200-1000 Pa.

13. The gas manifold of claim 1, further comprising a porous wall defining a flow path for the gas flow.

14. The gas manifold of claim 13, wherein the porous wall has an underpressure applied to it on a side opposite to the gas flow.

15. The gas manifold of claim 1, further comprising, on a wall defining a flow path for the gas flow, a plurality of elongate projections.

16. A module to provide a gas flow between two substantially parallel plates of an optical component of a lithographic apparatus, the module comprising a gas manifold to direct a gas flow between the two substantially parallel plates, the gas manifold comprising:
   an inlet to provide a gas flow to the gas manifold;
   a diffuser downstream of the inlet to provide a pressure drop in the gas flow;
   a flow straightener, downstream of the inlet, to straighten the flow of gas out of the diffuser;
   a contractor, downstream of the flow straightener, to reduce the cross sectional area through which the gas flow flows; and an outlet, downstream of the contractor, to provide the gas flow to the two plates.

17. The module of claim 16, further comprising a gas source to provide gas to the inlet to be directed between the two plates.

18. The module of claim 16, further comprising a capturing device configured to capture gas exiting from between the two plates.

19. A lithographic apparatus, comprising:
a projection system configured to project a patterned beam of radiation onto a target portion of a substrate;
two substantially parallel plates arranged transverse to and in a path of the beam of radiation, wherein at least one of the plates comprises an individually addressable electrical heating device configured locally to heat the plate; and
a gas manifold to direct a gas flow between the two substantially parallel plates, the gas manifold comprising:
an inlet to provide a gas flow to the gas manifold,
a diffuser downstream of the inlet to provide a pressure drop in the gas flow,
a flow straightener, downstream of the inlet, to straighten the flow of gas out of the diffuser,
a contractor, downstream of the flow straightener, to reduce the cross sectional area through which the gas flow flows, and
an outlet, downstream of the contractor, to provide the gas flow to the two plates.

20. A device manufacturing method comprising:
projecting a patterned beam of radiation onto a target portion of a substrate using a projection system;
locally changing an optical path length of the beam of radiation using two substantially parallel plates arranged transverse to and in the path of the beam of radiation, at least one of the plates being heated locally; and
providing a gas flow through a diffuser to provide a pressure drop in the gas flow, through a flow straightener to straighten the gas flow, through a contractor to reduce the cross sectional area through which the gas flow flows and to between the two plates downstream from the contractor.

* * * * *

UNITED STATES PATENT AND TRADEMARK OFFICE
CERTIFICATE OF CORRECTION

PATENT NO.         : 8,675,169 B2
APPLICATION NO.    : 13/273817
DATED              : March 18, 2014
INVENTOR(S)        : Frank Johannes Jacobus Van Boxtel et al.

It is certified that error appears in the above-identified patent and that said Letters Patent is hereby corrected as shown below:

On Title Page, Item (75) Inventors, Line 9
  replace "(IT)"
  with -- (NL) --.

On Title Page 2, Item (56) References Cited - Other Publications, Column 1
  after the second reference, replace "Satish C. Reddy et al., "On Stability of Streamwise Streaks Channel Flows," J. Fluid. Mech., pp 1-40 (Jan. 23, and Transition Thresholds in Plane 1998).
P. W. Carpenter et al., "Hydrodynamics and compliant Current Science, vol. 79, No. 6, pp. 758-765 (Sep. walls: Does the dolphin have a secret?" 25, 2000). cited by applicant.
Jerome Hoepffner et al., "Mechanisms of non-modal energy between compliant walls," J. Fluid Mech., vol. 642, pp. amplification in channel flow 489-507 (2010).
Mihailo R Jovanovic, "Turbulence suppression in channel wall oscillations," Phys. Fluids, vol. 20, No. 014101, pp. flows by small amplitude transverse 014101-1 - 014101-11 (2008).
S. J. Lee et al., "Flow field analysis of a turbulent boundary Experiments in Fluids, vol. 30, pp. 153-166 (2001). layer over a riblet surface,".
D.G. MacManus et al., "Measurement and Analysis of the Perforations," Aiaa Journal, vol. 36, No. 9, pp. 1553-1561 Flowfields Induced by Suction (Sep. 1998).
J. Goldsmith, "Research and Reports on Laminar Flow Northrop Aircraft Report No. Nai-56-304, pp. 1-72 (Mar. Boundary Layer Control Systems,".
Ronald D. Joslin, "Aircraft Laminar Flow Control," Ann. (1998). Review Fluid Mech., vol. 30, pp. 1-29.
D.G. MacManus et al., "Flow physics of discrete boundary predictions," J. Fluid Mech., vol. 417, pp. 47-75 (2000). layer suction-measurements and.
A. Elofsson et al., "Experiments on the stability of streamwise Physics of Fluids, vol. 11, No. 4, pp. 915-930 (Apr. 1999). streaks in plane Poiseuille flow,".
Fredrik Lundell et al., "Experiments on control of streamwise Mechanics B/ Fluids, vol. 22, pp. 279-290 (2003). streaks," European Journal of.
V. Theofilis et al., "Viscous linear stability analysis of rectangular Mech., vol. 505, pp. 249-286 (2004). duct and cavity flows," J. Fluid."

Signed and Sealed this
Nineteenth Day of August, 2014

Michelle K. Lee
*Deputy Director of the United States Patent and Trademark Office* with -- Satish C. Reddy et al., "On Stability of Streamwise Streaks and Transition Thresholds in Plane Channel Flows," J. Fluid. Mech., pp. 1-40 (January 23, 1998).
P. W. Carpenter et al., "Hydrodynamics and compliant walls: Does the dolphin have a secret?" Current Science, Vol. 79, No. 6, pp. 758-765 (September 25, 2000).
Jerome Hoepffner et al., "Mechanisms of non-modal energy amplification in channel flow between compliant walls," J. Fluid Mech., Vol. 642, pp. 489-507 (2010).
Mihailo R Jovanovic, "Turbulence suppression in channel flows by small amplitude transverse wall oscillations," Phys. Fluids, Vol. 20, No. 014101, pp. 014101-1 – 014101-11 (2008).
S. J. Lee et al., "Flow field analysis of a turbulent boundary layer over a riblet surface," Experiments in Fluids, Vol. 30, pp. 153-166 (2001).
D.G. MacManus et al., "Measurement and Analysis of the Flowfields Induced by Suction Perforations," AIAA Journal, Vol. 36, No. 9, pp. 1553-1561 (September 1998).
J. Goldsmith, "Research and Reports on Laminar Flow Boundary Layer Control Systems," Northrop Aircraft Report No. NAI-56-304, pp. 1-72 (March 1 through March 31, 1956).
Ronald D. Joslin, "Aircraft Laminar Flow Control," Ann. Review Fluid Mech., Vol. 30, pp. 1-29 (1998).
D.G. MacManus et al., "Flow physics of discrete boundary layer suction-measurements and predictions," J. Fluid Mech., Vol. 417, pp. 47-75 (2000).
A. Elofsson et al., "Experiments on the stability of streamwise streaks in plane Poiseuille flow." Physics of Fluids, Vol. 11, No. 4, pp. 915-930 (April 1999).
Fredrik Lundell et al., "Experiments on control of streamwise streaks," European Journal of Mechanics B/ Fluids, Vol. 22, pp. 279-290 (2003).
V. Theofilis et al., "Viscous linear stability analysis of rectangular duct and cavity flows," J. Fluid Mech., Vol. 505, pp. 249-286 (2004). --

On Title Page 2, Item (56) References Cited - Other Publications, Column 2
    replace "Kathtyn M. Butler et al., "Three-dimensional optimal perturbations Fluids a, vol. 4, No. 8, pp. 1637-1650 (Aug. 1992). in viscous shear flow," Phys.
Fabian Waleffe, "Homotopy of exact coherent structures vol. 15, No. 6, pp. 1517-1534 (Jun. 2003). in plane shear flows," Phys. Fluids,."
    with -- Kathtyn M. Butler et al., "Three-dimensional optimal perturbations in viscous shear flow," Phys. Fluids A, Vol. 4, No. 8, pp. 1637-1650 (August 1992).
Fabian Waleffe, "Homotopy of exact coherent structures in plane shear flows," Phys. Fluids, Vol. 15, No. 6, pp. 1517-1534 (June 2003). --